(12) United States Patent
Ramkumar

(10) Patent No.: US 7,365,403 B1
(45) Date of Patent: Apr. 29, 2008

(54) SEMICONDUCTOR TOPOGRAPHY INCLUDING A THIN OXIDE-NITRIDE STACK AND METHOD FOR MAKING THE SAME

(75) Inventor: Krishnaswamy Ramkumar, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 1164 days.

(21) Appl. No.: 10/074,884

(22) Filed: Feb. 13, 2002

(51) Int. Cl.
*H01L 27/108* (2006.01)

(52) U.S. Cl. .................. 257/410; 257/411; 257/412; 257/413; 257/286; 257/313; 257/E21.625; 257/E21.654; 438/197; 438/216; 438/287

(58) Field of Classification Search ............... 257/635, 257/100, 410, 324; 438/343, 265, 770, 769, 438/202, 635, 765
See application file for complete search history.

(56) References Cited

U.S. PATENT DOCUMENTS

| | | | |
|---|---|---|---|
| 4,749,640 A * | 6/1988 | Tremont et al. ............ 430/314 |
| 4,900,336 A | 2/1990 | Pittner et al. |
| 5,104,819 A * | 4/1992 | Freiberger et al. ............ 437/43 |
| 5,294,571 A | 3/1994 | Fujishiro et al. |
| 5,304,398 A * | 4/1994 | Krusell et al. ............... 427/255 |
| 5,412,246 A * | 5/1995 | Dobuzinsky et al. ........ 257/632 |
| 5,792,326 A | 8/1998 | Harada et al. |
| 5,803,980 A | 9/1998 | Pas et al. |
| 5,930,625 A * | 7/1999 | Lin et al. ..................... 438/253 |
| 6,040,233 A * | 3/2000 | Hodges ....................... 438/427 |
| 6,066,519 A * | 5/2000 | Gardner et al. ............. 438/197 |
| 6,077,791 A * | 6/2000 | DeTar ......................... 438/778 |
| 6,245,616 B1 * | 6/2001 | Buchanan et al. ........... 438/287 |
| 6,245,652 B1 * | 6/2001 | Gardner et al. ............. 438/592 |
| 6,319,775 B1 * | 11/2001 | Halliyal et al. .............. 438/261 |
| 6,380,056 B1 * | 4/2002 | Shue et al. .................. 438/591 |
| 6,451,660 B1 * | 9/2002 | Ma et al. ..................... 438/343 |
| 6,511,876 B2 * | 1/2003 | Buchanan et al. ........... 438/240 |
| 6,713,780 B2 * | 3/2004 | Lam ............................ 257/552 |
| 2002/0052124 A1 * | 5/2002 | Raaijmakers et al. ....... 438/778 |
| 2002/0142500 A1 * | 10/2002 | Foglietti et al. .............. 438/22 |

* cited by examiner

*Primary Examiner*—Sue A. Purvis
*Assistant Examiner*—Fazli Erdem
(74) *Attorney, Agent, or Firm*—Kevin L. Daffer; Mollie E. Lettang; Daffer McDaniel, LLP

(57) ABSTRACT

A semiconductor topography is provided which includes a silicon dioxide layer with a thickness equal to or less than approximately 10 angstroms and a silicon nitride layer arranged upon the silicon dioxide layer. In addition, a method is provided which includes growing an oxide film upon a semiconductor topography in the presence of an ozonated substance and depositing a silicon nitride film upon the oxide film. In some embodiments, the method may include growing the oxide film in a first chamber at a first temperature and transferring the semiconductor topography from the first chamber to a second chamber while the semiconductor topography is exposed to a substantially similar temperature as the first temperature. In either embodiment, the method may be used to form a semiconductor device including an oxide-nitride gate dielectric having an electrical equivalent oxide gate dielectric thickness of less than approximately 20 angstroms.

8 Claims, 3 Drawing Sheets

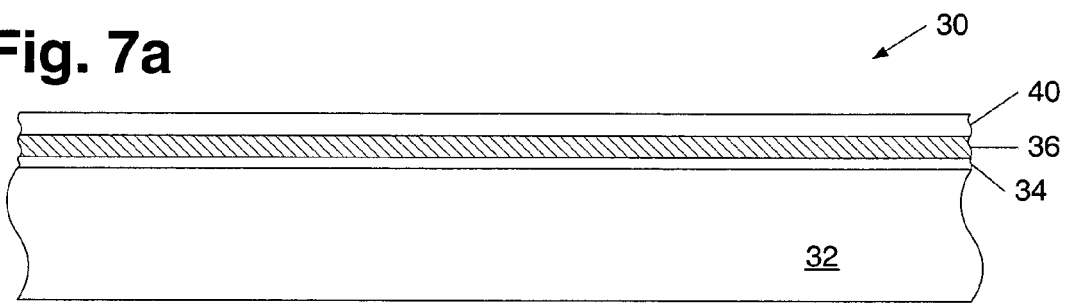
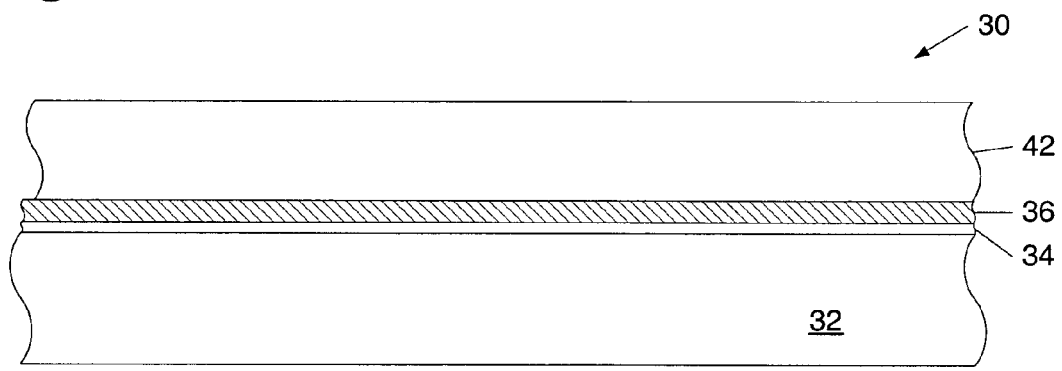
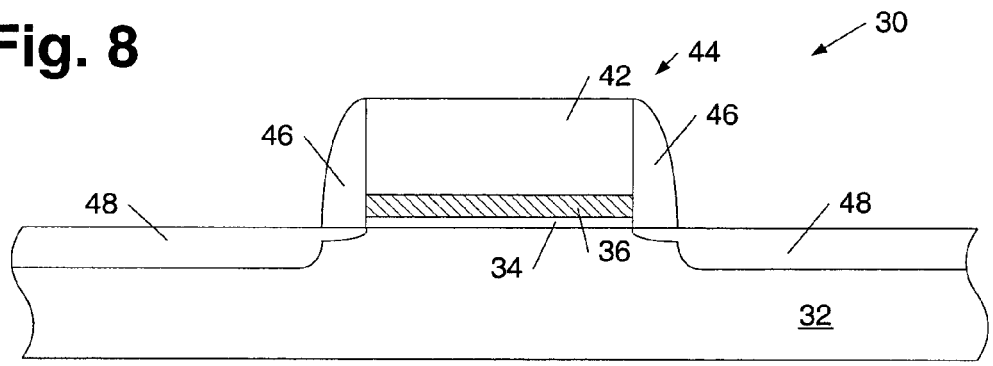

SEMICONDUCTOR TOPOGRAPHY INCLUDING A THIN OXIDE-NITRIDE STACK AND METHOD FOR MAKING THE SAME

BACKGROUND OF THE INVENTION

1. Field of the Invention

This invention relates to semiconductor device manufacturing, and more particularly, to an improved oxide-nitride layer and a method for making the same.

2. Description of the Related Art

The following descriptions and examples are not admitted to be prior art by virtue of their inclusion within this section.

Because of the increased desire to build faster and more complex integrated circuits, it has become necessary to increase the drive current of transistors by reducing the threshold voltage, $V_T$, necessary to activate the transistors. Several factors contribute to $V_T$, one of which is the gate-to-substrate capacitance. In general, the higher the gate-to-substrate capacitance, the lower the $V_T$ of a transistor and hence, the higher the drive current. The value of this capacitance may be dependent upon the thickness of the gate dielectric arranged between the gate and substrate and the permittivity or dielectric constant, K, of the gate dielectric. In particular, the gate to substrate capacitance of a transistor is generally directly proportional to the permittivity of the gate dielectric. As such, the relative permittivity, or dielectric constant of a gate dielectric limits the amount of gate-to-substrate capacitance that can be achieved when a transistor is in operation. In addition, the gate to substrate capacitance of a transistor typically increases with decreasing gate dielectric thickness. As a result, the switching speed (from off to on and vice versa) of a transistor with a relatively thin gate dielectric is faster than a transistor with a relatively thick gate dielectric. Consequently, a transistor with a relatively thin gate dielectric requires a lower $V_T$ with which to activate the transistor.

Silicon dioxide is widely used as the gate dielectric material in semiconductor devices. However, the use of a silicon dioxide gate dielectric (hereinafter referred to as a "gate oxide") may prevent a transistor from having a relatively low $V_T$. In particular, the $V_T$ of a transistor with a silicon dioxide gate dielectric is limited by the relatively low dielectric constant of silicon dioxide, which is approximately 3.7 to 3.8. In addition, the use of very thin silicon dioxide gate dielectrics may present several problems. For example, thin silicon dioxide films may give rise to significant substrate leakage current when subjected to an electric field. More specifically, a gate oxide, which is less than approximately 20 angstroms thick, may be subject to what is known as the quantum mechanical tunneling effect. In such an effect, a tunneling current may undesirably flow between the semiconductor substrate and the gate conductor and pass through the gate oxide. It is postulated that these electrons may become entrapped within the gate oxide by dangling bonds, resulting in a net negative charge density in the gate oxide. As the trapped charge accumulates with time, $V_T$ of the transistor may shift from its design specification. Thin gate oxides may also be subject to breakdown due to defects commonly formed during the growth of thin gate oxides. In particular, a thin gate oxide often contains pinholes and/or localized voids due to unevenness at which the oxide grows on a less than perfect silicon lattice. Such pinholes and voids may cause reliability failures within a transistor, for example. In addition, ultra thin gate oxides in p-type transistors may allow boron diffusion from the gate to the channel. Such diffusion may undesirably increase the $V_T$ of a transistor.

In addition, it is currently difficult to produce a gate oxide with a thickness less than 10 angstroms. In particular, the thickness and uniformity of an oxide layer that is less than 10 angstroms and is formed by conventional techniques is difficult to control across a semiconductor topography as well from wafer to wafer. Conventional processes typically include thermally growing a gate oxide upon a silicon substrate by a source of oxygen at a temperature of approximately 800° C. and approximately 900° C. The difficulty of growing a uniform, thin layer of oxide is primarily due to the rate of growth during such a process. In particular, it is often difficult to limit the growth of silicon oxide to 10 angstroms during such a process. In addition, the oxide layer is often subject to conditions, which allow the layer to continue to grow after completion of the thermal oxidation process. For example, significant oxide growth may occur while unloading wafers from the oxidation furnace. In some cases, the oxide layer may be subjected to conditions that allow an undesirable material to form on the oxide layer. In either case, such conditions (e.g., oxygen-containing atmospheres, heat, outgassing of storage containers) may be contained in further processing steps or during the transfer or storage of the semiconductor topography from one chamber to another.

As stated above, silicon dioxide is commonly used as a gate dielectric material in semiconductor devices. As such, the electrical properties of silicon dioxide at specific thicknesses may be well known. Due to the aforementioned problems associated with silicon oxide gate dielectrics, however, other materials are sometimes used for gate dielectrics. In some cases, it may be advantageous to describe the electrical properties of alternative materials in reference to the physical characteristics of silicon dioxide. In particular, it may be advantageous to describe the electrical properties, such as gate to substrate capacitance, of alternative materials in reference to the thickness of silicon dioxide including similar electrical properties. In such an embodiment, the alternative materials may be referred to as having an "electrically equivalent oxide thickness" as that of an oxide having a particular thickness. In other words, the alternative material may have electrical characteristics, which are similar to that of a certain thickness of silicon dioxide.

One alternative material used for gate dielectrics is an oxide-nitride stack. In such an embodiment, the gate dielectric may include a silicon nitride layer arranged upon and in contact with a silicon dioxide layer. Such a layer may be formed by thermally growing a silicon dioxide layer upon a substrate as described above and subsequently forming a nitride layer upon the oxide layer in a low-pressure chemical vapor deposition (LPCVD) chamber. The inclusion of nitride within a gate dielectric of a transistor may advantageously increase the gate-to-substrate capacitance of a transistor, and thereby decrease the $V_T$ of the transistor, since the dielectric constant of silicon nitride is approximately twice the dielectric constant of silicon dioxide. In this manner, the inclusion of nitride may advantageously decrease the electrical equivalent gate oxide thickness of a transistor. In addition, the higher dielectric constant of nitride may allow the gate dielectric to be thicker than a gate dielectric consisting entirely of silicon dioxide, thereby reducing substrate leakage current of the transistor. However, as the need to build integrated circuits faster and more complex increases, the thickness of oxide-nitride gate dielectrics needs to decrease. Unfortunately, the thicknesses of oxide-nitride gate dielectrics are limited by the thickness of the silicon dioxide layer. As explained above, the conventional process of thermally growing silicon oxide layers typically cannot form layers less than 10 angstroms. In addition, silicon oxide layers of less than 20 angstroms formed by such a process cause several problems, such as a lack of uniformity, a prevalent amount of defects, and quantum tunneling effects.

It would therefore be desirable to develop a method for fabricating an oxide-nitride layer with decreased thickness. It would further be desirable to use such a method for fabricating a transistor with an oxide-nitride gate dielectric having a low gate-to-substrate capacitance that is substantially resistant to gate dielectric breakdown. In addition, it may be advantageous to produce such a gate dielectric for a p-type transistor in which the diffusion of boron from the gate to the channel is significantly reduced.

SUMMARY OF THE INVENTION

The problems outlined above may be in large part addressed by a thin, uniform oxide-nitride layer and a method for making the same. In particular, a semiconductor topography is provided which includes a silicon dioxide layer with a thickness equal to or less than approximately 10 angstroms and a silicon nitride layer arranged upon and in contact with the silicon dioxide layer. In addition, a method is provided which includes growing an oxide film upon a semiconductor topography in the presence of an ozonated substance and depositing a silicon nitride film upon and in contact with the oxide film. In some embodiments, the method may include growing the oxide film in a first chamber at a first temperature and transferring the semiconductor topography from the first chamber to a second chamber while the semiconductor topography is exposed to a substantially similar temperature as the first temperature. In such embodiment, the method may further include forming a nitride layer upon the oxide film in the second chamber at a second temperature. In either embodiment, the method may be used to form a semiconductor device comprising an oxide-nitride gate dielectric having an electrically equivalent oxide gate dielectric thickness of less than approximately 20 angstroms. In some cases, such a semiconductor device may have a substantially similar gate-to-substrate capacitance as an oxide gate dielectric with a thickness less than approximately 20 angstroms.

As stated above, a semiconductor topography is described herein that includes a silicon dioxide layer with a thickness equal to or less than approximately 10 angstroms. In some cases, the thickness of the silicon dioxide layer may be between approximately 6 angstroms and approximately 10 angstroms. The semiconductor topography may further include a silicon nitride layer arranged upon and in contact with the silicon dioxide layer. Such a silicon nitride layer may include a thickness greater than approximately 15 angstroms. In some embodiments, the silicon nitride layer may include a thickness between approximately 15 angstroms and approximately 20 angstroms. In addition, the thickness of the oxide and nitride layers in combination may vary by less than approximately 5% across the semiconductor topography. In some embodiments, the semiconductor topography may include a second silicon dioxide layer arranged upon and in contact with the silicon nitride layer.

In some cases, the oxide-nitride combination layer may be arranged upon and in contact with a polysilicon layer. More specifically, the silicon dioxide layer of the oxide-nitride combination layer may be arranged upon and in contact with a polysilicon layer. In such an embodiment, the oxide-nitride layer may serve as an interlevel dielectric and/or an etch stop layer within a semiconductor topography. Alternatively, the oxide-nitride layer, or more specifically, the silicon dioxide layer, may be arranged upon and in contact with a silicon-based semiconductor substrate. In such an embodiment, the oxide-nitride layer may serve as a gate dielectric of a semiconductor device.

Consequently, a semiconductor device is provided herein, which includes an oxide-nitride gate dielectric having similar electrical characteristics as an oxide gate dielectric with a thickness less than approximately 20 angstroms. In other words, a semiconductor device is provided with an oxide-nitride gate dielectric having an electrically equivalent oxide gate dielectric thickness of less than approximately 20 angstroms. In some cases, such an oxide-nitride gate dielectric may have a substantially similar gate to substrate capacitance as an oxide gate dielectric with a thickness less than approximately 20 angstroms. In some cases, the oxide-nitride gate dielectric may have a substantially similar gate to substrate capacitance as an oxide gate dielectric having a thickness between approximately 10 angstroms and approximately 15 angstroms. In either embodiment, the oxide-nitride gate dielectric may be denser than an oxide gate dielectric formed at such a specific thickness. In addition or alternatively, the oxide-nitride gate dielectric may include fewer defects than an oxide gate dielectric formed at such a specific thickness. Moreover, the oxide-nitride gate dielectric may include an oxide thickness between approximately 6 angstroms and approximately 10 angstroms and a nitride thickness between approximately 15 angstroms and approximately 20 angstroms. In addition or alternatively, the oxide-nitride gate dielectric may include a thickness that varies by less than approximately 5% across the semiconductor topography.

A method for processing a semiconductor topography is also contemplated herein. More specifically, a method for forming an oxide-nitride stack is described herein. Such a method may include growing an oxide film upon a semiconductor topography in the presence of an ozonated substance. In some embodiments, the ozonated substance may include ozonated deionized water. In other cases, the ozonated substance may include ozonated deuterium oxide. In either embodiment, the ozonated substance may include an ozone concentration between approximately 20 ppm and approximately 50 ppm. In some embodiments, the method may include cleaning the semiconductor topography prior to growing the oxide film. In such an embodiment, growing the oxide film may include rinsing the semiconductor topography with the ozonated substance to remove remnants of the cleaning process. In addition, the method may include growing the oxide film in a first chamber at a first temperature and transferring the semiconductor topography from the first chamber to a second chamber such that the semiconductor topography is exposed to a substantially similar temperature as the first temperature. In some cases, such a first temperature may be between approximately 10° C. and approximately 30° C.

The method may further include depositing a silicon nitride film upon and in contact with the oxide film. In some cases, the method may include forming the silicon nitride film in a second chamber at a second temperature. Such a second chamber and temperature may be separate and distinct from the first chamber and temperature used to form the underlying silicon oxide film. For example, the second temperature may be between approximately 750° C. and approximately 800° C. in some embodiments. In some cases, the method may further include annealing the semiconductor topography subsequent to depositing the silicon nitride film. In some embodiments, annealing the semiconductor topography may include exposing the semiconductor topography to ammonia or nitrous oxide. In other embodiments, annealing the semiconductor topography may include exposing the semiconductor topography to deutereated ammonia. In either embodiment, the method may include annealing the semiconductor topography at a third temperature subsequent to forming the nitride layer. Such a third temperature may be between approximately 750° C. and approximately 850° C. In yet another embodiment, the method may include forming a second oxide film upon and in contact with the nitride film at a fourth temperature, wherein the fourth temperature is greater than the first temperature.

There may be several advantages to processing a semiconductor topography according to the method described herein. For example, a relatively thin oxide-nitride layer may be formed within a semiconductor topography. In particular, an oxide-nitride layer with an oxide portion less than approximately 10 angstroms and a nitride portion less than approximately 20 angstroms may be formed. Such a thin oxide-nitride layer may advantageously avoid the problems associated with thin silicon dioxide layers, such as dielectric breakdown and diffusion of impurities through the layer, such as the diffusion of boron with a p-type transistor. In addition, the method as described herein may advantageously produce an oxide-nitride layer with fewer defects than a thin oxide layer formed from conventional techniques. Consequently, a semiconductor device with an oxide-nitride layer may be formed from the method described herein. In this manner, a semiconductor device with an oxide-nitride gate dielectric having a lower electrical gate oxide thickness and therefore, sometimes a greater gate-to-substrate capacitance than a device with an oxide gate dielectric may be formed. Such an increase gate-to substrate capacitance may advantageously lower the $V_T$ of the semiconductor device. In addition, a semiconductor device with such an oxide-nitride gate dielectric may have reduced quantum tunneling effects as compared to a semiconductor device with an oxide gate dielectric.

BRIEF DESCRIPTION OF THE DRAWINGS

Other objects and advantages of the invention will become apparent upon reading the following detailed description and upon reference to the accompanying drawings in which:

FIG. 7a depicts a partial cross-sectional view of the semiconductor topography in which a second silicon dioxide film is formed upon the silicon nitride film subsequent to the annealing process of FIG. 6;

FIG. 7b depicts a partial cross-sectional view of the semiconductor topography in which a gate layer is formed upon the silicon nitride film subsequent to the annealing process of FIG. 6; and FIG. 8 depicts a partial cross-sectional view of the semiconductor topography in which the gate layer, silicon nitride film, and silicon dioxide film is patterned to form a gate structure subsequent to the gate layer formation in FIG. 7b, and wherein spacers and diffusion regions are formed laterally adjacent to the gate structure.

Figure 1:
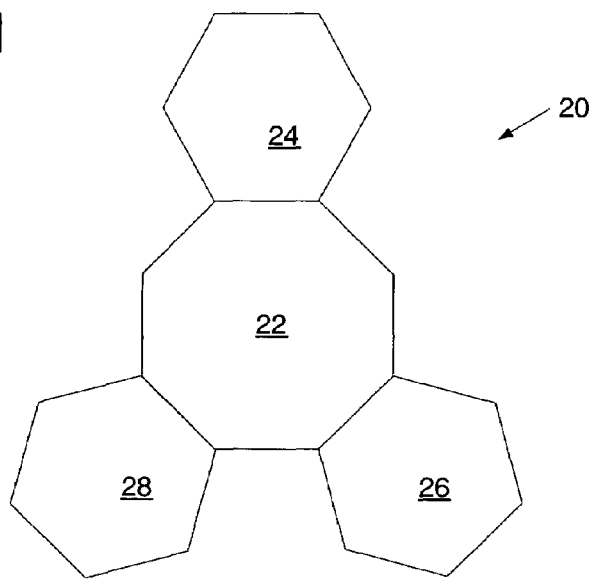
FIG. 1 depicts a partial top view of a cluster tool used for processing semiconductor topographies.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary apparatus for processing a semiconductor topography according to the method described herein is shown in FIG. 1. In particular, cluster tool 20 may include transfer chamber 22 with load chamber 24, oxidation chamber 26, and deposition chamber 28 coupled thereto. Load chamber 24 may be used to load and unload semiconductor topographies to and from transfer chamber 22. Oxidation chamber 26 and deposition chamber 28, on the other hand, may be used for processing such semiconductor topographies. In particular, oxidation chamber 26 may be used to oxidize a layer, such as a silicon-based layer as described below. In contrast, deposition chamber 28 may be used for the deposition of a layer, such as silicon nitride. In some embodiments, cluster tool 20 may be used to form a silicon nitride film upon and in contact with an oxide film such that an oxide-nitride layer may be formed. In addition or alternatively, other process chambers (not shown) may be coupled to transfer chamber 22 such that additional fabrication processes may be conducted prior to or subsequent to the processes of oxidation chamber 26 and/or deposition chamber 28. Transfer chamber 22 may be used to transport the semiconductor topographies to and from the chambers coupled thereto. In addition, transfer chamber 22 may be a vacuum-sealed chamber such that exposure to the ambient external to the tool is prevented. In some embodiments, transfer chamber 22 may be maintained at room temperature. Alternatively, transfer chamber 22 may be heated or cooled. In some cases, transfer chamber 22 may be maintained at substantially the same temperature as oxidation chamber 26.

Figure 2:
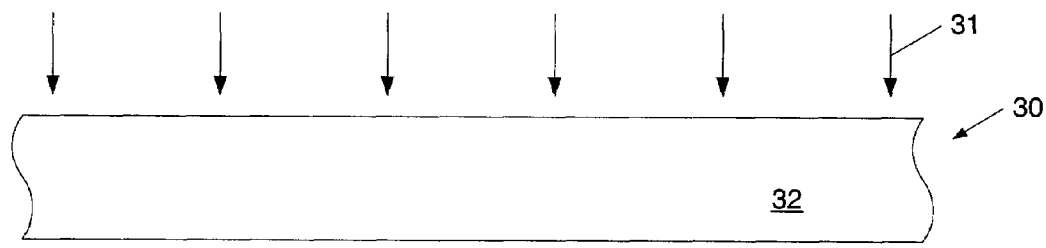
FIG. 2 depicts a partial cross-sectional view of a semiconductor topography in which a semiconductor layer is cleaned.

Exemplary embodiments of a method for processing a semiconductor topography are shown in FIGS. 2-8. In particular, exemplary embodiments of a method for forming an oxide-nitride stack within a semiconductor topography is provided. FIG. 2 depicts a partial cross-sectional view of semiconductor topography 30 in which semiconductor layer 32 is subjected to cleaning process 31. Semiconductor layer 32 may be a silicon-based semiconductor substrate such as a monocrystalline silicon, silicon-germanium, silicon-oninsulator, or silicon-on-sapphire substrate. In addition, semiconductor layer 32 may be doped either n-type or p-type. Alternatively, semiconductor layer 32 may include structures and layers formed upon a semiconductor substrate. The structures and layers may include, but are not limited to, dielectric layers, metallization layers, gate structures, contact structures, vias, or local interconnect wires. In such an embodiment, the upper surface of semiconductor layer 32 may include a silicon-based layer, such as polysilicon. In either embodiment, semiconductor layer 32 may include isolation regions or diffusion regions (not shown).

Cleaning process 31 may be used to remove contaminants formed upon the upper surface of semiconductor layer 32. Such contaminants may include undesirable films or particulates formed upon semiconductor layer 32 during the formation or processing of semiconductor layer 32. In other cases, the contaminants may form on semiconductor layer 32 during storage of semiconductor topography 30. In addition or alternatively, cleaning process 31 may be used to remove oxide films existing on the surface of semiconductor layer 32. In general, cleaning process 31 may include any chemistry adapted to remove oxide and/or contaminants. For example, in some embodiments, cleaning process 31 may include hydrofluoric acid. In addition, the application of such a chemistry may be in the form of a liquid or a vapor.

In some cases, cleaning process 31 may be conducted within the same process chamber as the oxidation process described below. For instance, in an embodiment in which cluster tool 20 of FIG. 1 is used, cleaning process 31 may be conducted within oxidation chamber 26 prior to oxidizing semiconductor topography 30. Alternatively, cleaning process 31 may be conducted within another processing chamber (not shown) coupled to transfer chamber 22. In such an embodiment, semiconductor topography 30 may be transported to oxidation chamber 26 subsequent to cleaning process 31 through transfer chamber 22. Since transfer chamber is vacuum-sealed, no other contaminants may be formed upon the topography during the transfer. In yet another embodiment, the cleaning process 31 may be omitted from the method described herein. In such an embodiment, the method may start with FIG. 3 with the formation of oxide film 34 as described below.

Figure 3:
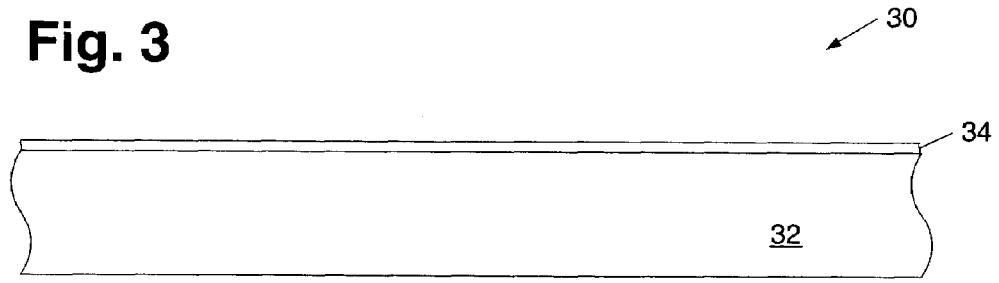
FIG. 3 depicts a partial cross-sectional view of a semiconductor topography in which a silicon dioxide film is formed upon the semiconductor layer subsequent to the cleaning of the semiconductor layer in FIG. 2.

FIG. 3 illustrates the formation of oxide film 34 upon and in contact with semiconductor layer 32. Such a formation of oxide film 34 may include exposing semiconductor layer 32 to an ozonated substance subsequent to cleaning process 31 of FIG. 2. An ozonated substance may refer to a substance containing the triatomic form of oxygen known as ozone ($O_3$). For example, the ozonated substance may include ozonated deionized water ($H_2O$). In other cases, the ozonated substance may include ozonated deuterium oxide ($D_2O$). Deuterium may refer to an isotope of hydrogen that has twice the mass of ordinary hydrogen. Consequently, deuterium oxide may, in some embodiments, be referred to as "heavy water". As such, ozonated deuterium oxide may be referred to ozonated heavy water in some cases. In general, the ozonated substance may include only a small fraction of ozone as compared to other oxygen molecules within the substance. As such, ozonated deionized water may be referred to as $H_2O$ and ozonated deuterium oxide may be referred to as $D_2O$ without the inclusion of $O_3$ included therein.

In general, the ozonated substance may be adapted to oxidize semiconductor layer 32. It is postulated that the additional oxygen atoms contained within ozone serve as free ions adapted to react with available ions of an exposed material. In this manner, a substance containing ozone may react with a silicon-containing material to form a silicon dioxide film as shown in FIG. 3. In some cases, the ozonated substance may be adapted to concurrently remove remnants of cleaning process 31. As such, the ozonated substance may be applied directly after cleaning process 31. In other embodiments, there may be a pause between cleaning process 31 and the application of the ozonated substance.

Furthermore, the application of the ozonated substance may be conducted in a variety of manners. For example, the ozonated substance may be applied in the form of a liquid or a vapor. As such, the ozonated substance may be applied at a variety of temperatures. For instance, the ozonated substance may be applied at temperatures ranging from approximately 10° C. and 1000° C. In a preferred embodiment, the ozonated substance may be applied at a temperature between approximately 20° C. and 25° C. In some embodiments, the ozonated substance may be applied at the substantially the same temperature of the transfer chamber connected to the oxidation chamber. In this manner, the temperature differential during the process of transferring the semiconductor topography between the oxidation process and the subsequent nitride deposition process may be minimized. In general, the application of the ozonated substance may advantageously form an oxide film, which is of higher quality than films formed after conventional wet-cleaning techniques. For example, the application of an ozonated substance may produce an oxide film that is more dense than oxide layers grown using conventional methods. In addition or alternatively, an oxide film formed from an ozonated substance may have fewer defects than an oxide layer grown from conventional techniques. In particular, an oxide film formed from an ozonated substance may include less pinholes and voids than an oxide layer grown from conventional methods.

In some embodiments, the ozonated substance may include an ozone concentration between approximately 1 ppm and approximately 50 ppm. In yet other embodiments, the ozonated substance may include an ozone concentration between approximately 20 ppm and approximately 50 ppm. Alternatively, concentrations of ozone greater than 50 ppm may be used. However, an ozonated substance with a concentration greater than approximately 50 ppm of ozone may form an oxide film with a thickness greater than approximately 10 angstroms. In order to limit the thickness of the subsequently formed oxide-nitride layer, oxide film 34 is preferably formed to a thickness of less than approximately 10 angstroms. In some cases, oxide film 34 may be formed to a thickness between approximately 6 angstroms and approximately 10 angstroms. As such, using ozonated substances with ozone concentration less than approximately 50 ppm may be desirable.

Figure 4:
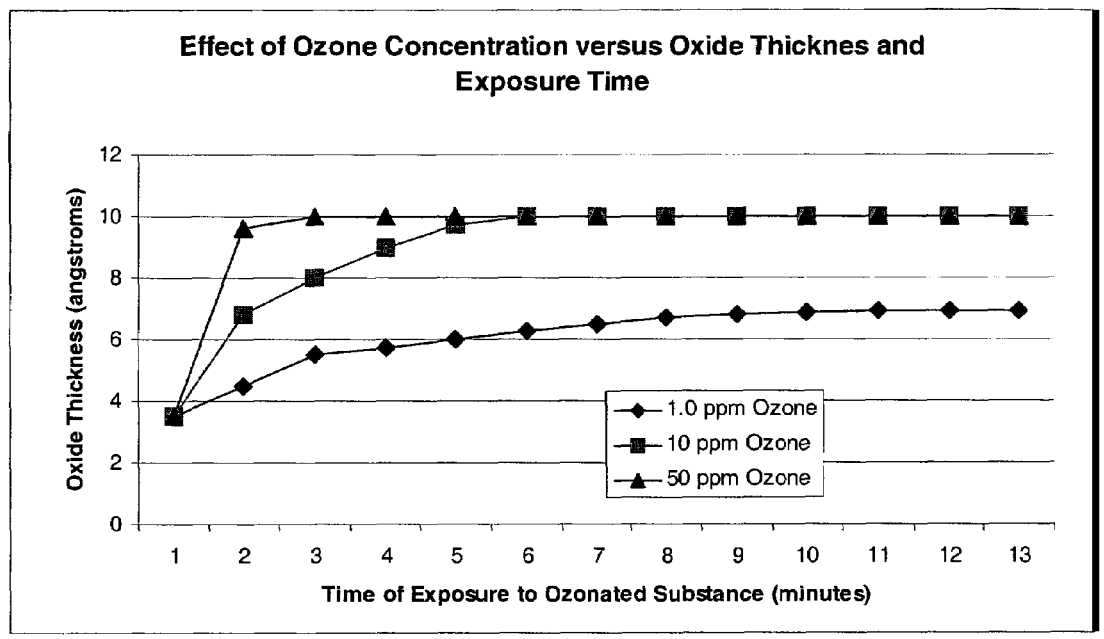
FIG. 4 depicts a graph detailing the effects of ozone concentration within an ozonated substance versus oxide thickness and exposure time.

As shown in the graph of FIG. 4, the ozone concentration of an ozonated substance may affect the thickness and growth rate of an oxide film. In particular, the lower the concentration of ozone within an ozonated substance, the lower the growth rate of the oxide film. Consequently, an oxide film grown from an ozonated substance with a high concentration of ozone may be thicker than an oxide film grown from an ozonated substance with a lower concentration of ozone for a specific amount of exposure time. In this manner, the thickness of an oxide film may also be dependent upon the amount of time a semiconductor topography is exposed to an ozonated substance. In particular, the thickness of an oxide film may increase with increased exposure to an ozonated substance. For instance, an ozonated substance with approximately 10 ppm of ozone that is dispensed for approximately three minutes may produce an oxide film with a thickness of approximately 7 angstroms. The thickness of an oxide film exposed to an ozonated substance with the same amount of ozone concentration for approximately 10 minutes, however, may be approximately 10 angstroms. Ozonated substances with other concentrations of ozone may behave similarly as shown with the 1.0 ppm and 50 ppm concentration profiles of FIG. 4.

FIG. 4 also illustrates that the growth of an oxide film at a particular ozone concentration may level off at a particular thickness after a specific period of time. For example, oxide films produced from an ozonated substance with an ozone concentration of 50 ppm may achieve a thickness of 10 angstroms relatively quickly (i.e. at after approximately 3 minutes). However, dispensing such an ozonated substance for a longer period of time may not generate a substantially thicker oxide film as illustrated in FIG. 4. In this manner, the thickness of oxide films formed by ozonated substances may be self-limiting, depending on the ozone concentration of the substance. Consequently, oxide films grown by ozonated substances may be extremely uniform in thickness. In particular, the thickness of an oxide film grown from an ozonated substance may vary by less than approximately 5% across a semiconductor topography. As shown in the graph of FIG. 4, ozonated substances with ozone concentrations less than approximately 50 ppm may behave similarly. Longer dispense times for such lower concentrations, however, may be necessary before upper thickness limits may be achieved. Consequently, the concentration of ozone used within an ozonated substance and the amount of exposure time of the ozonated substance may be optimized to produce an oxide film of a specific thickness.

Figure 5:
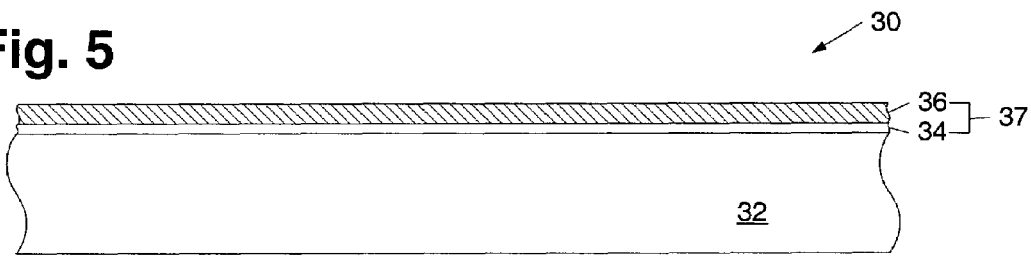
FIG. 5 depicts a partial cross-sectional view of the semiconductor topography in which a silicon nitride layer is formed upon the silicon dioxide film subsequent to the formation of the silicon dioxide film in FIG. 3.

FIG. 5 illustrates the formation of silicon nitride film 36 upon and in contact with oxide film 34. The formation of silicon nitride film 36 may be conducted within a deposition chamber, such as chamber 28, separate from the oxidation chamber used to form silicon dioxide film 34. For example, silicon nitride film 36 may be formed within a LPCVD chamber. Other deposition chambers, however, may be used depending on the parameters of the fabrication process. In general, the thickness of silicon nitride film 36 may be greater than approximately 15 angstroms. In some embodiments, silicon nitride film 36 may have a thickness between approximately 15 angstroms and approximately 20 angstroms. Silicon dioxide film 34 and silicon nitride film 36 may together form oxide-nitride layer 37.

The method for the formation of such a layer as described herein may offer several benefits over oxide-nitride layers formed by conventional methods. For example, oxide-nitride layer 37 may vary in thickness by less than approximately 5% across semiconductor topography 30. In other words, the thicknesses of any two points along oxide-nitride layer 37 may not vary by more than approximately 5%. In addition, a relatively thin oxide-nitride layer may be formed within a semiconductor topography. Such a thin oxide-nitride layer may advantageously avoid the problems associated with thin silicon dioxide layers, such as dielectric breakdown and diffusion of impurities through the layer, such as the diffusion of boron with a p-type transistor. In addition, the method as described herein may advantageously produce an oxide-nitride layer with fewer defects and a greater density than a thin oxide layer formed from conventional techniques.

Figure 6:
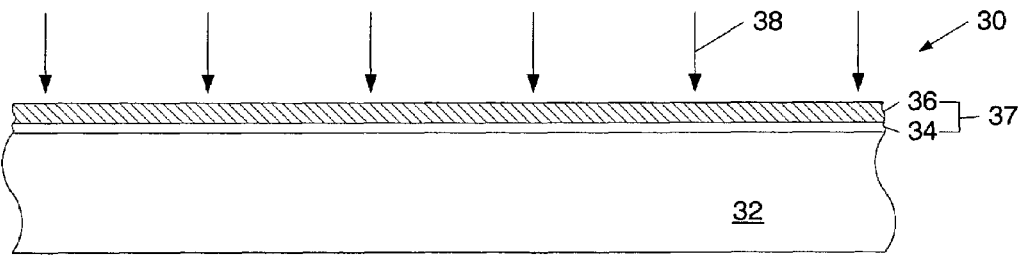
FIG. 6 depicts a partial cross-sectional view of the semiconductor topography being annealed subsequent to the formation of the silicon nitride film in FIG. 5.

In some embodiments, semiconductor topography 30 may be annealed subsequent to the formation of silicon nitride film 36 as shown in FIG. 6. In particular, semiconductor topography 30 may be exposed to nitrogen-ambient 38 at a temperature between approximately 750° C. and 850° C.

Such an annealing process may advantageously improve the quality of oxide-nitride stack 37 by incorporating nitrogen in the interfaces of the layer. In some embodiments, annealing the semiconductor topography may include exposing the semiconductor topography to ammonia or nitrous oxide. In other embodiments, annealing the semiconductor topography may include exposing the semiconductor topography to deutereated ammonia. In yet other embodiments, semiconductor topography 30 may not be annealed. In such an embodiment, the method of processing semiconductor topography 30 may continue for FIG. 5 to FIG. 7a or 7b as described below.

Subsequent to the formation of silicon nitride film 36 or the annealing of oxide-nitride layer 37, semiconductor topography 30 may be processed in different manners depending on the design specifications of the device. For example, in an embodiment in which semiconductor layer 32 is a doped polysilicon layer, second oxide film 40 may be formed upon and in contact with oxide-nitride stack 37 such that an oxide/nitride/oxide (ONO) layer may be formed as shown in FIG. 7a. Such a layer may be thermally grown upon silicon nitride film 36 in an oxygen-containing atmosphere at a temperature between approximately 800° C. and approximately 1100° C. In addition, the thickness of second oxide film 40 may be greater than approximately 20 angstroms. In particular, the thickness of second oxide film 40 may be between approximately 20 angstroms and 30 angstroms. Further processing of semiconductor topography 30 may continue subsequent to the formation of second oxide film 40 depending on the fabrication process of the device.

In an embodiment in which semiconductor layer 32 is a silicon-based substrate, oxide-nitride stack 37 may serve as a gate dielectric. In such an embodiment, gate layer 42 may be formed upon and in contact with oxide-nitride stack 37 as illustrated in FIG. 7b. Gate layer 42 may include any conductive material, such as doped polysilicon, aluminum, titanium, tungsten, or a metal alloy thereof. Subsequently, gate layer 42 and oxide-nitride stack 37 may be patterned to form gate structure 44 as shown in FIG. 8. Alternatively, only gate layer 42 may be patterned to form gate structure 44. In this manner, oxide-nitride layer 37 may extend across semiconductor topography 30. Subsequent to the formation of gate structure 44, spacers 46 and source and drain regions 48 may be formed as shown in FIG. 8.

Consequently, a semiconductor device with an oxide-nitride layer having similar electrical characteristics of an oxide gate dielectric with a thickness less than approximately 20 angstroms may be formed. In other words, a semiconductor device may be formed with an oxide-nitride gate dielectric having an electrically equivalent oxide gate dielectric thickness of less than approximately 20 angstroms. In some cases, such an oxide-nitride gate dielectric may have a substantially similar gate to substrate capacitance as an oxide gate dielectric with a thickness less than approximately 20 angstroms. In other embodiments, such an oxide-nitride gate dielectric may have a substantially similar gate to substrate capacitance as an oxide gate dielectric with a thickness between approximately 10 angstroms and approximately 15 angstroms. Such an increase gate-to-substrate capacitance may advantageously lower the $V_T$ of the semiconductor device. In addition, a semiconductor device with such an oxide-nitride gate dielectric may have reduced quantum tunneling effects as compared to a semiconductor device with an oxide gate dielectric.

It will be appreciated to those skilled in the art having the benefit of this disclosure that this invention is believed to provide an oxide-nitride layer and a method for fabricating such a layer. Further modifications and alternative embodiments of various aspects of the invention will be apparent to those skilled in the art in view of this description. For example, the method described herein may be used for forming an oxide-nitride stack upon any silicon-based layer within a semiconductor topography. It is intended that the following claims be interpreted to embrace all such modifications and changes and, accordingly, the drawings and the specification are to be regarded in an illustrative rather than a restrictive sense.

What is claimed is:

1. A semiconductor device comprising an oxide-nitride gate dielectric having substantially equal gate to substrate capacitance as an oxide gate dielectric comprising a thickness less than approximately 20 angstroms, wherein the oxide-nitride gate dielectric comprises:
   a silicon dioxide layer and a distinct silicon nitride layer; and
   a thickness that varies by less than approximately 5% across the semiconductor topography.

2. The semiconductor device of claim 1, wherein said oxide-nitride gate dielectric has a substantially equal gate to substrate capacitance as an oxide gate dielectric having a thickness between approximately 10 angstroms and approximately 15 angstroms.

3. The semiconductor device of claim 1, wherein said silicon dioxide layer comprises a thickness between approximately 6 angstroms and approximately 10 angstroms, and wherein said distinct silicon nitride layer comprises a thickness between approximately 15 angstroms and approximately 20 angstroms.

4. A method for forming an oxide-nitride stack upon a semiconductor topography, comprising:
   growing an oxide film upon the semiconductor topography in a first chamber at a first temperature, wherein said growing comprises rinsing the semiconductor topography with an ozonated substance;
   transferring the semiconductor topography from said first chamber to a second chamber, wherein said transferring comprises exposing the semiconductor topography to a substantially equal temperature as said first temperature;
   forming a nitride layer upon the oxide film in said second chamber at a second temperature; and
   forming a second oxide film upon and in contact with the nitride film at a fourth temperature, wherein said fourth temperature is greater than the first temperature.

5. The method of claim 4, wherein said first temperature is between approximately 10° C. and approximately 30° C.

6. The method of claim 4, wherein said second temperature is between approximately 750° C. and approximately 800° C.

7. The method of claim 4, further comprising annealing said semiconductor topography at a third temperature subsequent to said forming the nitride layer.

8. The method of claim 7, wherein said third temperature is between approximately 750° C. and approximately 850° C.

* * * * *